United States Patent [19]

Skjaveland et al.

[11] Patent Number: 5,600,598
[45] Date of Patent: Feb. 4, 1997

[54] MEMORY CELL AND WORDLINE DRIVER FOR EMBEDDED DRAM IN ASIC PROCESS

[75] Inventors: Karl Skjaveland, Ramsay Township; Peter B. Gillingham, Kanata, both of Canada

[73] Assignee: Mosaid Technologies Incorporated, Kanata, Canada

[21] Appl. No.: 355,956

[22] Filed: Dec. 14, 1994

[51] Int. Cl.⁶ .................................................... G11C 7/00
[52] U.S. Cl. ...................... 365/189.11; 365/149; 257/296
[58] Field of Search ........................ 365/189.11, 189.09, 365/230.06, 149; 257/296, 313, 306

[56] References Cited

U.S. PATENT DOCUMENTS

| | | | |
|---|---|---|---|
| 4,167,018 | 9/1979 | Ohba | 257/296 |
| 5,373,476 | 12/1994 | Jeon | 257/296 |
| 5,374,839 | 12/1994 | Jeon | 257/296 |
| 5,404,329 | 4/1995 | Yamagata | 365/189.11 |
| 5,446,688 | 8/1995 | Torimaru | 365/145 |

*Primary Examiner*—A. Zarabian
*Attorney, Agent, or Firm*—Pascal & Associates

[57] ABSTRACT

A DRAM charge storage structure including a p-channel access FET in an n⁻ doped well of a p⁻ doped substrate, a p⁻ channel charge storage capacitor, conductive apparatus connecting a gate of the charge storage capacitor to a drain of the FET, and apparatus for applying a boosted word line voltage to a gate of the FET.

5 Claims, 4 Drawing Sheets

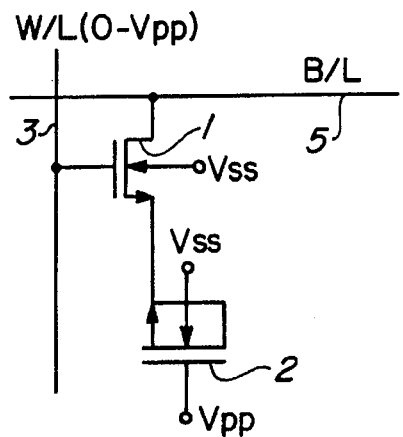
PRIOR ART
FIG. 1A
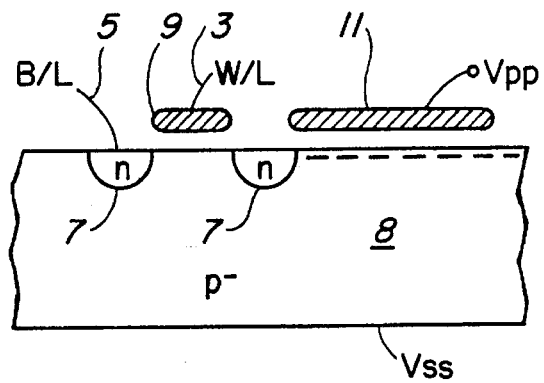
PRIOR ART
FIG. 1B
PRIOR ART
FIG. 1C
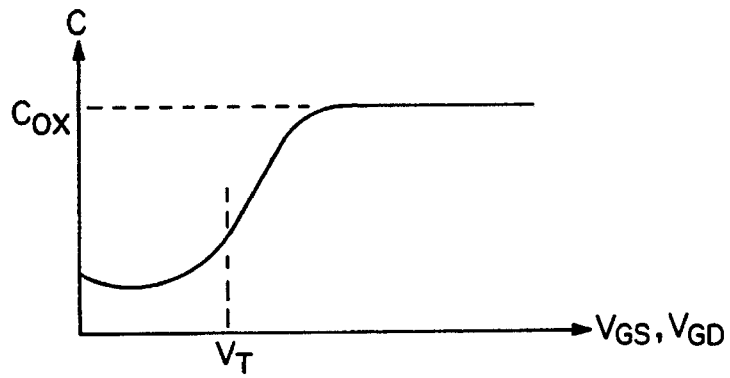
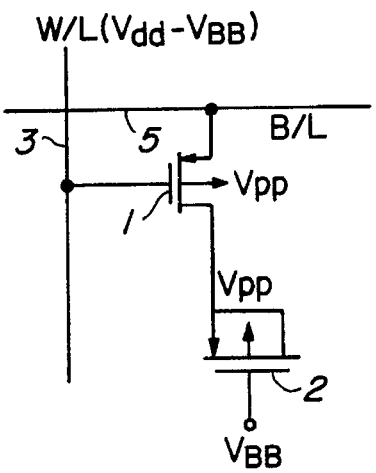
FIG. 2A
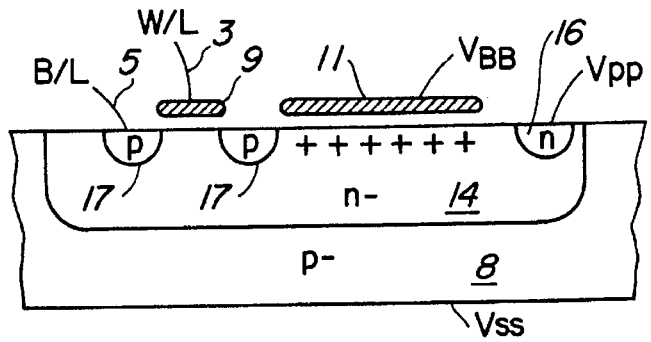
FIG. 2B

MEMORY CELL AND WORDLINE DRIVER FOR EMBEDDED DRAM IN ASIC PROCESS

FIELD OF THE INVENTION

This invention relates to a charge storage structure for a dynamic random access memory (DRAM) and a wordine driver which are particularly useful in an ASIC.

BACKGROUND TO THE INVENTION

With reference to FIGS. 1A and 1B, a standard DRAM utilizes a charge storage cell for storing a data bit which is comprised of a cell access FET 1 which has its gate connected to a word line 3 and its drain connected to a bit line 5. A capacitor, created using field effect technology, is connected between source of FET 1 and a voltage source, shown as $V_{pp}$.

When such a charge storage cell is fabricated for DRAMs, special processing techniques are used to optimize its structure. However, when implementing an imbedded DRAM in an ASIC process, the special processing techniques and structures cannot be used.

Some of the techniques and structures that cannot be used in fabricating DRAMs in ASICs are as follows. DRAMs of 1 Mbits per chip and earlier used planar capacitors with special oxides and implants to maintain linearity over the full range of stored charge levels. DRAMs with densities of 4 Mbits per chip or greater make use of stacked capacitor or trench capacitor structures.

DRAM cells in standard DRAM chips reside either in an isolation well (e.g. using a triple well process), or in the chip substrate that has a back bias voltage applied. This structure protects the memory cells from disturbances caused by peripheral logic and input/output pin switching.

Cell access transistors in standard DRAM have well controlled subthreshold current from a combination of special implant and/or back bias. Extended refresh intervals can be achieved only if the subthreshold leakage is minimized.

In implementing DRAM cells in an ASIC, the structure and voltages illustrated in FIG. 1B can be used, which in many ways resembles a DRAM storage cell. The FET 1 is implemented as an n channel device having n doped diffused regions 7 in a p⁻ doped substrate 8, and a conductive gate 9 above and insulated from the n channel. The capacitor 2 is an n channel device formed of a conductive plate 11 overlying the substrate 8 next to an n region 7. The bit line 5 carrying charge to be stored by the capacitor is connected to the other n region, and the word line 3, which carries voltage to enable the FET to transfer the charge carried by the bitline to the capacitor n channel, is connected to the gate of the FET. A voltage $V_{ss}$ is applied to the substrate 8.

However the plate 11 of the capacitor must be held at a high positive voltage $V_{pp}$ so that the n channel below it remains inverted even with a voltage of $V_{dd}$ stored by the capacitor, so that the capacitor behaves as a linear device. If it does not, the capacitance would vary as shown in FIG. 1C, where $C_{OX}$ is the capacitor capacitance, $V_{GD}$ and $V_{GD}$ are the gate to source or gate to drain voltage of the capacitor, and $V_T$ is the device threshold voltage. It is desirable to maintain $C_{OX}$ in the constant capacitance region of the curve.

Further, the wordline must be driven to the high positive voltage $V_{pp}$, so that a full $V_{dd}$ voltage level can be written into the capacitor.

The above structure has found have problems when used in an ASIC process. For example, the p- doped substrate has $V_{ss}$ connected to it, not a back bias voltage $V_{BB}$ as used in memory processes. Undershoot noise from peripheral circuits or input output pins can inject minority carriers into the substrate, which can destroy stored data.

Further, since there is no back bias voltage on the memory cell access FET, subthreshold leakage from the capacitor is high, and as a result charge retention time by the cell is relatively low.

FIGS. 2A and 2B illustrate a schematic circuit and corresponding chip crossection of a storage cell which uses a p channel capacitor for storage of charge, and a p channel FET. In this case the memory cell is contained in an n- well 14, and is protected from peripheral circuitry by a $V_{pp}$ voltage biasing the n- region. The $V_{pp}$ voltage is applied to the n-region by means of an n doped region 16 contained in region 14.

The cell access FET is a p channel device having p doped regions 17 on opposite sides of its p channel, and a gate conductor 9 overlying the channel. The cell capacitor is formed of conductive plate 11 located with one edge adjacent one of the p regions 17. A negative voltage $V_{BB}$ is connected to the conductive plate 11.

With the n- well biased at a $V_{pp}$ higher than $V_{dd}$, subthreshold leakage to the substrate 8 is inhibited. However the wordline 3, which is held at $V_{dd}$ voltage in the off state, must go negative to a voltage lower than $V_{ss}$ in order to fully turn on the cell access FET, and allow a full $V_{ss}$ voltage level to be stored by the cell. The gate (conductive plate 11) of the capacitor must be held at the negative $V_{BB}$ level to maintain an inverted channel below it, even when a zero ($V_{ss}$) is stored.

However, the voltage $V_{BB}$ cannot be generated in normal CMOS circuits since the p⁻ substrate 8 is connected to $V_{ss}$. A negative voltage cannot be connected to any n- channel source or drain because it would forward bias to the substrate. P- channel dynamic circuits must be used to generate the $V_{BB}$ voltage and in the wordline driver.

Further, channel to n⁻ well 14 leakage occurs, which affects retention of stored data.

SUMMARY OF THE INVENTION

The present invention is a structure for storage of charge which avoids charge leakage from the storage capacitor to the substrate, and eliminates the requirement for a continuous voltage $V_{BB}$. The structure is highly suitable for use in ASICs.

In accordance with an embodiment of the invention, a DRAM charge storage structure is comprised of a p-channel access FET in an n⁻ doped well of a p⁻ doped substrate, a p⁻ channel charge storage capacitor, conductive apparatus connecting a plate of the capacitor to a drain of the FET, and apparatus for applying a boosted word line voltage to a gate of the FET.

In accordance with another embodiment, a DRAM charge storage structure is comprised of a charge storage capacitor structure connected between a high voltage source $V_{pp}$ and a source-drain circuit of a storage cell access FET, the gate of the storage cell access FET being connected to a wordline. The cell access FET is comprised of first and second p doped regions separated by a channel and contained in an n⁻ doped region of a p⁻ doped substrate. The capacitor is comprised of an FET having a gate conductive region insulated from and disposed above the intrinsic n⁻ doped channel region. The gate conductive region of the capacitor is connected to the second p doped region of the FET spaced from the conductive region. A third p doped region is contained in the n⁻ doped channel region adjacent the edge of the conductive region. An n doped region is contained in the n⁻ doped region spaced from the third p doped region, A high voltage $V_{pp}$ is applied to the n doped region and to the third p doped region. The bit line is connected to the first p doped region. Voltage is applied from the wordline to a gate of the cell access FET which is boosted from the wordline voltage $V_{dd}$.

BRIEF INTRODUCTION TO THE DRAWINGS

A better understanding of the invention will be obtained by reading the description of the invention below, with reference to the following drawings, in which:

FIG. 1A is a schematic diagram of an n-channel DRAM storage cell,

FIG. 1B is a chip crossection of the circuit of FIG. 1,

Figure 3A:
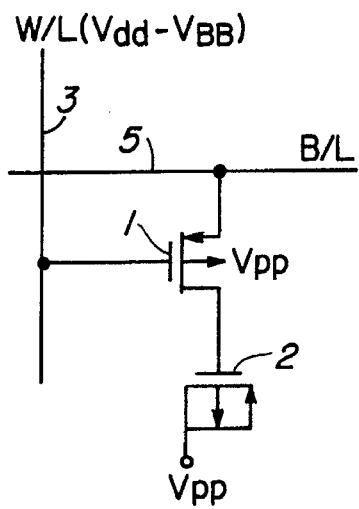
Figure 3B:
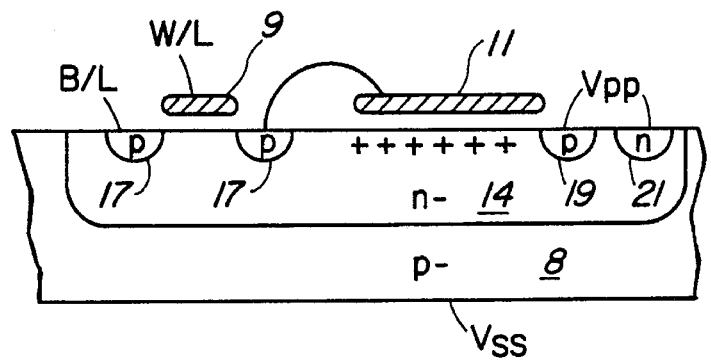
Figure 4A:
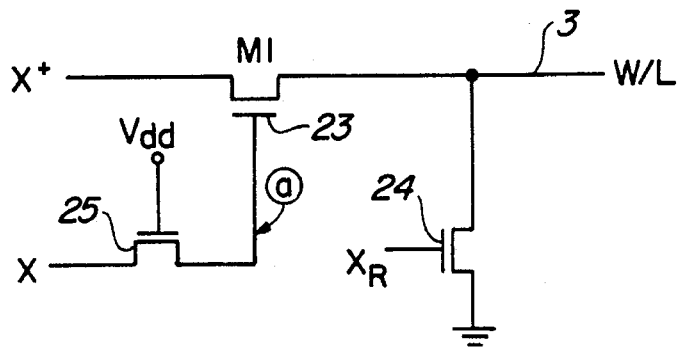
Figure 4B:
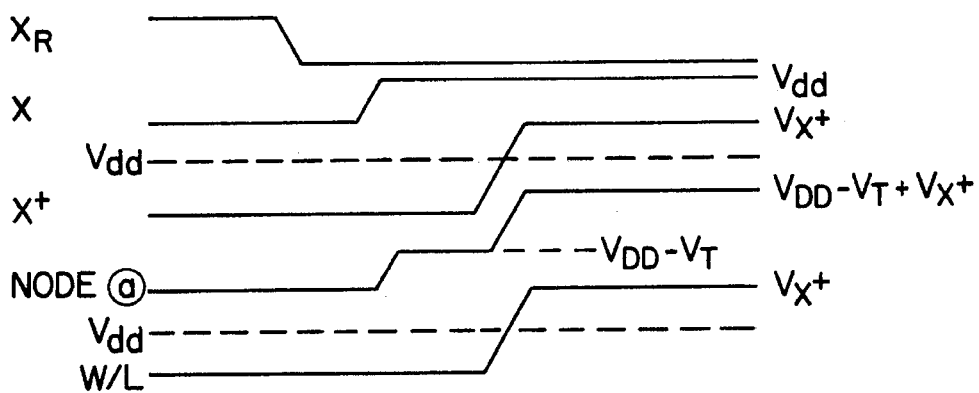
Figure 5A:
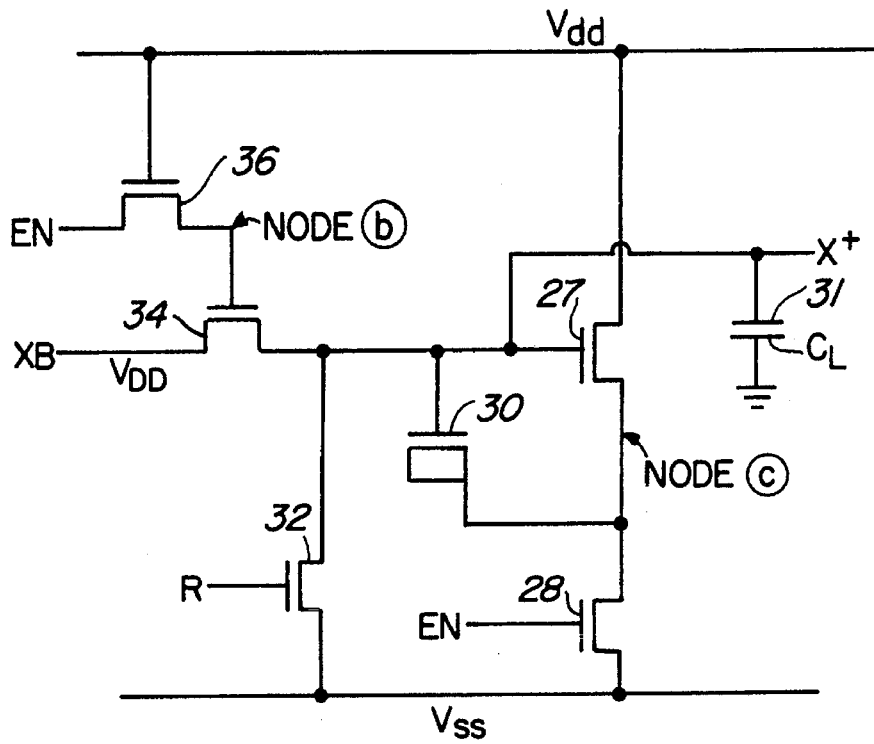
Figure 5B:
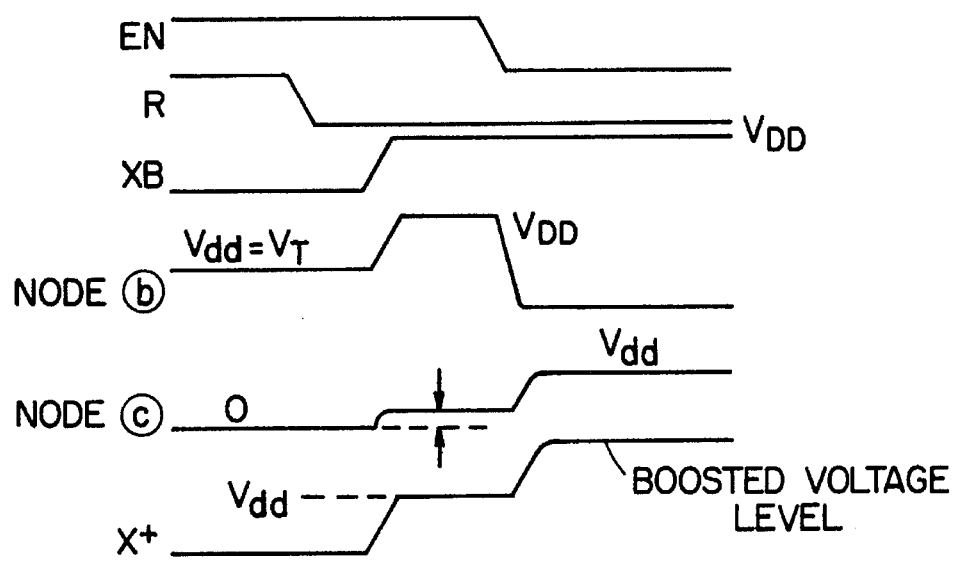
Figure 6:
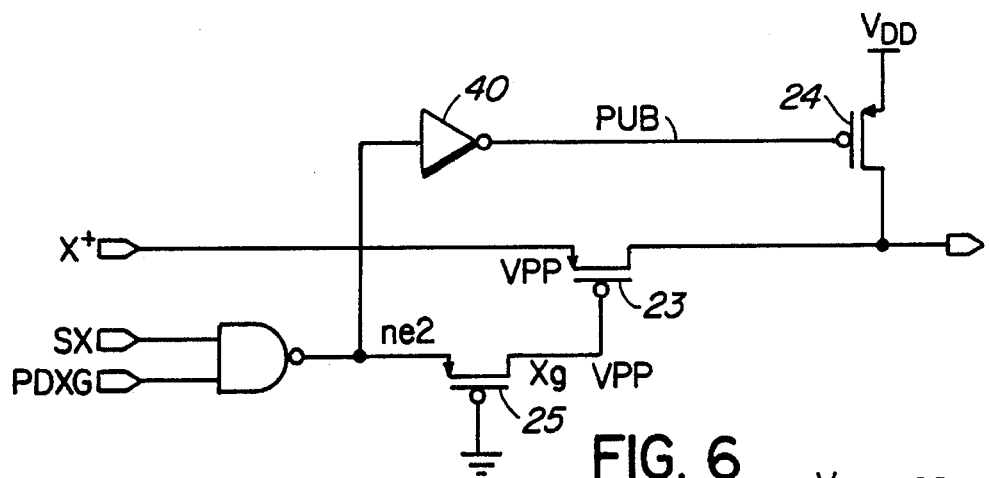
Figure 7A:
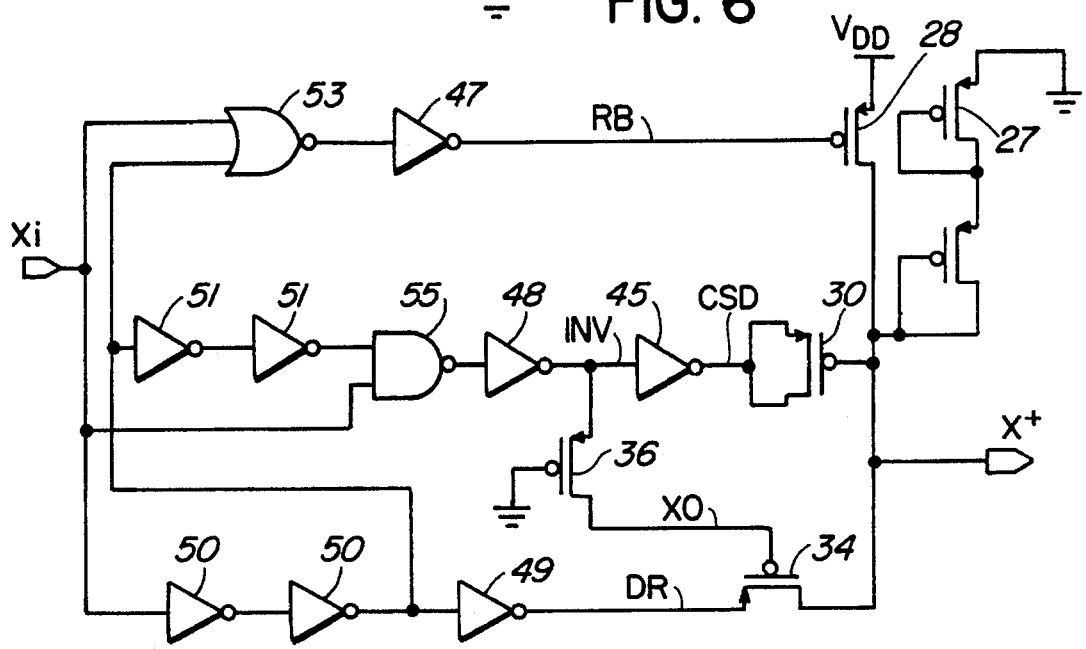
Figure 7B:
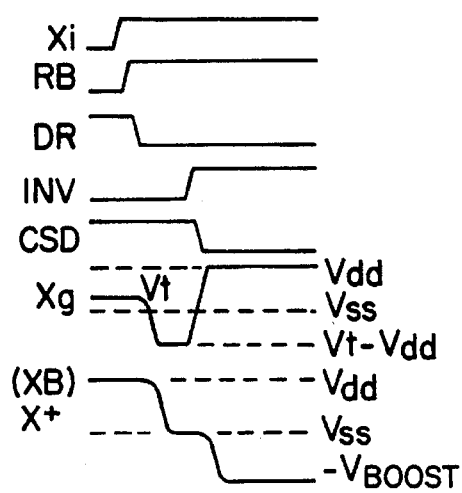

FIG. 1C is a graph of capacitance vs gate to source or gate to drain voltage of the access FET of the circuit of FIG. 1, FIG. 2A is a schematic diagram of a p-channel DRAM storage cell, FIG. 2B is a chip crossection of the circuit of FIG. 2A, FIG. 3A is a schematic diagram of a p-channel DRAM storage cell in accordance with the present invention, FIG. 3B is a chip crossection of the circuit of FIG. 1, FIG. 4A is an n-channel word line driving circuit, FIG. 4B is a graph of voltage vs time for the circuit of FIG. 4A, FIG. 5A is a schematic diagram of an n-channel secondary wordline driver circuit which can generate a voltage required in the circuit of FIG. 4A, FIG. 5B is a timing chart of voltages in the circuit of FIG. 5A, FIG. 6 is a schematic diagram of a p-channel word line driving circuit based on the circuit of FIG. 4A, FIG. 7A is a schematic diagram of a p-channel secondary wordline driver circuit in accordance with the present invention which can generate a voltage required in the circuit of FIG. 6, and FIG. 7B is a timing chart of signals in the circuit of FIG. 7A.

DETAILED DESCRIPTION OF THE INVENTION

Turning now to FIGS. 3A and 3B, a p-channel FET and a p-channel capacitor are used, contained within an n⁻ well 14 of a p⁻ substrate 8 as in the embodiment of FIGS. 2A and 2B. In this case, however, the capacitor is spaced from the cell access FET, but its plate 11 is connected to an adjacent p doped region 17 of the cell access FET.

A further p doped region 19 is contained in the n⁻ well 14 adjacent the edge of the plate 11, connected to the high voltage $V_{pp}$. As a result a p channel ++++ is formed under the plate 11, as shown.

An n doped region 21 is contained spaced from the p doped region 19, which is also connected to $V_{pp}$. This biased n doped region biases the n⁻ well 14 as described with reference to FIG. 2B. The p⁻ substrate 8 is connected to $V_{ss}$, as in the embodiment of FIG. 2B.

It will be noticed by comparing the storage capacitors 2 of FIG. 2A and FIG. 3A, that the field effect device is reversed in the embodiment of FIG. 3A. The source and drain of the capacitor in FIG. 3A is connected to $V_{pp}$, while the gate is connected to the drain of FET 1. The plate 11 in FIG. 3B is connected to the drain of FET 1 while in FIG. 2A it is connected to $V_{BB}$. $V_{BB}$ is not used in FIG. 3A.

A boosted negative wordline driving voltage is applied to the gate of FET 1. Circuits to provide the appropriate voltage will now be described with reference to the circuits of FIGS. 4A and 4B.

Turning now to FIGS. 4A and 4B, a word line driving circuit is shown, as well as a voltage time chart for that circuit. An X+ voltage is applied via the source-drain circuit of an FET 23 to the word line 3. The word line is connected to ground via the source-drain circuit of an FET 24. An X voltage is applied to the gate of FET 23 via the source-drain circuit of FET 25. A wordline reset voltage $V_R$ is applied to the gate of FET 24, and the voltage $V_{dd}$ is applied to the gate of FET 25.

Both X and X+ voltages are wordline address signals decoded from wordline address circuitry. Prior to the cycle, the reset signal $X_R$ is high, causing conduction of FET 24, and the wordline is brought to ground voltage level. At the start of a row cycle, the wordline reset signal $X_R$ turns off, and FET 24 becomes non-conductive. Then the decoded signal X for the selected wordline increases from 0 to $V_{dd}$. This raises node a to the voltage $V_{dd}$–$V_T$, where $V_T$ is the operation threshold of FET 25.

A boosted X address signal X+ then goes high, and as shown in FIG. 4B, is higher than $V_{dd}$ due to it's boost. Now assuming that the ratio of gate oxide capacitance to stray capacitance plus FET 25 drain capacitance is high, node a will track the rise of the X+ voltage, due to capacitive coupling. This will allow FET 23 to pass the voltage X+ (a supervoltage) to the wordline.

FIG. 5A is a schematic diagram of a secondary wordline driver based on circuits employed in the Mostek MK4116 16K NMOS DRAM circuit, which can generate the voltage X+, and FIG. 5B is a timing chart of voltages in the circuit of FIG. 5A. The source-drain circuits of a pair of FETs are connected in series between a voltage rail $V_{dd}$ and $V_{ss}$. The X+ voltage output line, which is to be connected to the X+ voltage line in the circuit of FIG. 4A, is bypassed to ground by load capacitance $C_L$. A field effect capacitor 30 is connected between the output line X+ and the junction of FETs 27 and 28. The output line X+ is connected to $V_{ss}$ via the source-drain circuit of an FET 32, and is connected to a signal source XB via the source-drain circuit of FET 34. A signal source EN is applied to the gate of FET 34 (node b) via the source-drain circuit of FET 36, as well as to the gate of FET 28. The gate of FET 36 is connected to a $V_{dd}$ rail. The signal source R is applied to the gate of FET 32.

In the quiescent state, both plates of capacitor 30 are held at $V_{ss}$, due to FETs 28 and 32 being enabled, with the EN and R signals at high logic level. Then the FET 32 is turned off by the input signal R going to low logic level, and the signal XB is raised from $V_{ss}$ to $V_{DD}$. Self bootstrapping on node b in a manner similar to already described with reference to the circuit of FIG. 4A allows the full $V_{dd}$ level to charge up the top plate of capacitor 30. Now both FETs 27 and 28 pass current from $V_{dd}$ to $V_{ss}$ due to FET 27 being enabled (as well as FET 28 being enabled. The bottom plate of capacitor 30, connected to the junction of FETs 27 and 28, will be at a voltage above $V_{ss}$ level, as determined by the relative strengths of FET 27 and FET 28. Thus at this stage of operation, the voltage X+ has been raised from $V_{ss}$ to $V_{DD}$.

Now the EN signal goes to low logic level. This causes FET 28 to cease conduction, releasing the bottom plate of capacitor 30 from $V_{ss}$. Simultaneously, FET 34 is caused to cease conduction due to the EN voltage applied via FET 36 to the gate of FET 34 going to low logic level. Due to conduction of FET 27, the bottom plate of capacitor 30 is raised to $V_{dd}$ via the source-drain circuit of FET 27.

The gate-source bias of FET 27 is established by the voltage across capacitor 30, which will be full $V_{dd}$, i.e. 5 volts. The output X+ is brought up to a voltage equal to $$V_{X+}=V_{dd}+5(C_{30}/(C_L+C_{30}))$$

(where C30 and CL are the capacitances of capacitor 30 and capacitor CL respectively) assuming that the junction of FETs 27 and 28 (the bottom plate of capacitor 30) was originally held virtually at $V_{ss}$ via FET 28, although it is shown in FIG. 5B as a voltage level somewhat higher than $V_{ss}$.

It should be noted that all of the FETs used in the above-noted wordline driver and secondary wordline driver circuits are of one channel conductivity type, and are preferred to be n-channel. However, the circuits could be inverted and used to drive a wordline from $V_{dd}$ down to a voltage below $V_{ss}$, using only p-channel devices. If voltage and power wasted in the latter case at the junction of FETs 27 and 28 (node c), a full CMOS inverter can be used to drive the bottom plate of capacitor 30 instead of FETs 27 and 28.

FIG. 6 illustrates a wordline driver circuit, corresponding the circuit of FIG. 4A, using p-channel devices. The corresponding FETs have been labeled the same as in FIG. 4A. In this case, however, rather than FET 24 being connected to ground, it is connected to $V_{DD}$, and instead of the gate of FET 25 being connected to $V_{dd}$, it is connected to ground. The $X_R$ signal applied to the gate of FET 24 is derived from the X signal, through an inverter 40. This circuit is derived from the known circuit of FIG. 4 by simply inverting the logic and replacing n-channel devices with p-channel.

FIG. 7A illustrates an X+ voltage generating circuit that uses only p-channel FETs. This circuit represents an improvement over a simple transformation of the circuit of FIG. 5 (which it is not) because the problem of crowbar current through devices 27 and 28 of FIG. 5 is eliminated.

The top plate (gate) of an FET p-channel FET capacitor 30 is connected to the X+ node which is an input to the circuit of FIG. 6. A CMOS inverter 45 has its output connected to the bottom plate (source-drain) of capacitor 30. The source-drain circuit of p-channel FET 36 is connected between the input of capacitor 30 and the gate 34 of p-channel FET 34. The gate of FET 36 is connected to ground. The drain of FET 34 is connected to the node X+.

Also connected to the node X+ is the drain of p-channel FET 32, the source of which is connected to voltage source $V_{DD}$. The drain and gate of p-channel FET 27B are connected to the X+ node and the drain and gate of p-channel FET 27A are connected to the source of FET 27B. The source of FET 27A is connected to ground.

The gate of FET 32, the input to inverter 45 and the source of FET 34 are each driven by respective inverters 47, 48 and 49.

The input to the circuit for receiving an Xi signal (corresponding to the X input of FIG. 5A) is connected through a pair of serially connected inverters 50, the output of which is connected both to the input of inverter 49 and to the input of serially connected inverters 51, as well as to an input of NOR gate 53. The output of the pair of inverters 51 is connected to an input of NAND gate 55 which has its output connected to the input of inverter 48. The other input to gates 53 and 55 are connected to the input for receiving signal Xi.

FIG. 7B illustrates a timing diagram for the various signals at the locations indicated in FIG. 7A.

In operation, the gate of FET 32 is at low logic level, FET 32 conduits and the X+ node is at high logic level $V_{DD}$. Upon the Xi signal going to high logic level, the signal goes high. FET 32 ceases conduction as may be seen after a delay caused by the delay chain formed of inverters 50 and 49, the dr signal goes to low logic level. With rb high and dr low, FETs 32 not conducting and FET 34 conducting, the Xt node goes low, to $V_{ss}$. After a delay caused by delay chain 51 and inverter 48, INV goes high and CSD the output of inverter 45 (the lower plate of capacitor 30) goes low. The xg node has gone low, the $V_t-V_{dd}$, then with FET 36 conductive due to INV goes high, xg goes high, to $V_{dd}$. The bottom plate of capacitor 30 is then boosted, and Xt goes to low voltage, $-V_{boost}$.

FETs 27A and 27B are configured as diodes and form a clamp to restrict the output voltage to $-2 V_t$ or higher, where $V_t$ is a conductive threshold voltage of an FET.

The bottom plate of capacitor is thus driven by a CMOS inverter 45 rather than 2 p-channel transistors. Therefore the bottom plate of capacitor 30 can be fully charged to $V_{DD}$ prior to the boost phase, resulting in greater efficiency and less power consumption. The additional logic circuits are included to generate rb, INV and dr signals which correspond respectively to the R, EN and XB signals in FIG. 5A. The inverter creating the csd signal replaces devices 27 and 28 in the circuit of FIG. 5A.

The elements that correspond to those of FIG. 5A are similarly labeled.

A person understanding this invention may now conceive of alternative structures and embodiments or variations of the above. All of those which fall within the scope of the claims appended hereto are considered to be part of the present invention.

I claim:

1. A DRAM charge storage structure comprising a p-channel access FET in an n⁻ doped well of a p⁻ doped substrate, a p⁻ channel charge storage capacitor, conductive means connecting a gate of the charge storage capacitor to a drain of the FET, and means for applying a boosted word line voltage to a gate of the FET, the charge capacitor having p⁺ doped source/drain region diffused into the n⁻ well, means for connecting the p⁺ doped region to a voltage source $V_{pp}$ which is high enough to maintain the channel of the charge storage capacitor upon the capacitor receiving charge defining any of 0 or 1 logic levels, an n doped region diffused into the n⁻ well, and means for connecting the n doped region to a voltage source which is sufficiently high so as to reduce sub-threshold leakage through the p-channel access FET.

2. A DRAM charge storage structure comprising a charge storage capacitor means connected between a high voltage source $V_{pp}$ and a source-drain circuit of a storage cell access FET, the source-drain circuit being connected to a wordline, the cell access FET being comprised of first and second p doped regions separated by a channel and contained in an n⁻ doped region of a p⁻ doped substrate, the capacitor being comprised of an FET having a conductive gate region insulated from and disposed above the channel and a third p-doped region adjacent to the channel, means for connecting the conductive gate region of the capacitor to the second p doped region of the FET spaced from the conductive region, an n doped region contained in the n⁻ doped region spaced from the third p doped region, means for applying the high voltage $V_{pp}$ to the n doped region and the third p doped region, means for connecting the bit line to the first p doped region, and means for applying a voltage from the wordline to a gate of the storage cell access FET which is boosted from the wordline voltage $V_{dd}$.

3. A structure as defined in claim 2 in which the FETs and the means for applying the boosted wordline voltage are all formed of only p channel type FETs.

4. A structure as defined in claim 1 in which the FET and the means for applying the boosted wordline voltage are all formed of only p channel type FETs.

5. A structure as defined in claim 1 in which the means for applying the boosted wordline voltage is formed of only p channel type FETs.

* * * * *